US012645385B2

(12) United States Patent
Ratnam et al.

(10) Patent No.: US 12,645,385 B2
(45) Date of Patent: *Jun. 2, 2026

(54) PROVIDING RECOVERED DATA TO A NEW MEMORY CELL AT A MEMORY SUB-SYSTEM BASED ON AN UNSUCCESSFUL ERROR CORRECTION OPERATION

(71) Applicant: MICRON TECHNOLOGY, INC., Boise, ID (US)

(72) Inventors: Sampath K. Ratnam, San Jose, CA (US); Vamsi Pavan Rayaprolu, Santa Clara, CA (US); Mustafa N. Kaynak, San Diego, CA (US); Sivagnanam Parthasarathy, Carlsbad, CA (US); Kishore Kumar Muchherla, San Jose, CA (US); Shane Nowell, Boise, ID (US); Peter Feeley, Boise, ID (US); Qisong Lin, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 129 days.

This patent is subject to a terminal disclaimer.

(21) Appl. No.: 18/526,103

(22) Filed: Dec. 1, 2023

(65) Prior Publication Data

US 2024/0103749 A1     Mar. 28, 2024

Related U.S. Application Data

(63) Continuation of application No. 17/350,866, filed on Jun. 17, 2021, now Pat. No. 11,868,639, which is a
(Continued)

(51) Int. Cl.
G06F 3/06 (2006.01)
G06F 11/10 (2006.01)
(Continued)

(52) U.S. Cl.
CPC .......... G06F 3/0647 (2013.01); G06F 3/0619 (2013.01); G06F 3/0673 (2013.01);
(Continued)

(58) Field of Classification Search
CPC ...... G06F 3/064; G06F 3/0656; G06F 3/0683; G06F 3/0631; G06F 3/0635;
(Continued)

(56) References Cited

U.S. PATENT DOCUMENTS 7,954,037 B2    5/2011 Lasser et al.
8,837,064 B1    9/2014 Wu et al.
(Continued)

FOREIGN PATENT DOCUMENTS

CN            105144302 A    12/2015

OTHER PUBLICATIONS

Cai Y., et al., "Errors in Flash-Memory-Based Solid-State Drives: Analysis, Mitigation, and Recovery," Nov. 28, 2017, 86 Pages, arXiv: 1711.11427v2, XP081304598.
(Continued)

*Primary Examiner* — Francisco A Grullon
(74) *Attorney, Agent, or Firm* — Lowenstein Sandler LLP

(57) ABSTRACT

At least one data of a set of data stored at a memory cell of a memory component is determined to be associated with an unsuccessful error correction operation. A determination is made as to whether a programming operation associated with the set of data stored at the memory cell has completed. The at least one data of the set of data stored at the memory cell that is associated with the unsuccessful error correction operation is recovered in response to determining that the programming operation has completed. Another memory cell of the memory component is identified in response to recovering the at least one data of the set of data stored at the memory cell that is associated with the unsuccessful error
(Continued)

correction operation. The set of data including the recovered at least one data is provided to the other memory cell of the memory component.

20 Claims, 8 Drawing Sheets

Related U.S. Application Data continuation of application No. 16/100,681, filed on Aug. 10, 2018, now Pat. No. 11,068,186.

(60) Provisional application No. 62/628,706, filed on Feb. 9, 2018.

(51) Int. Cl.
*G06F 11/14* (2006.01)
*G11C 29/52* (2006.01)

(52) U.S. Cl.
CPC ...... *G06F 11/1068* (2013.01); *G06F 11/1402* (2013.01); *G11C 29/52* (2013.01)

(58) Field of Classification Search
CPC ...... G06F 3/0679; G06F 3/0622; G06F 3/061; G06F 13/42; G06F 3/0629; G06F 13/382; G06F 12/0802; G06F 12/0246; G06F 12/1009
See application file for complete search history.

(56) References Cited

U.S. PATENT DOCUMENTS

| | | | |
|---|---|---|---|
| 9,818,488 B2 | 11/2017 | Sankaranarayanan et al. | |
| 10,180,868 B2 | 1/2019 | Alhussien et al. | |
| 10,540,228 B2 | 1/2020 | Kaynak et al. | |
| 10,892,029 B1 | 1/2021 | Xie et al. | |
| 2009/0287975 A1 | 11/2009 | Kim et al. | |
| 2011/0126045 A1 | 5/2011 | Bennett | |
| 2011/0182121 A1* | 7/2011 | Dutta | G11C 11/5628 |
| | | | 365/189.05 |
| 2014/0059406 A1 | 2/2014 | Hyun et al. | |
| 2015/0100847 A1 | 4/2015 | Ojalvo et al. | |
| 2015/0154089 A1 | 6/2015 | Wu et al. | |
| 2015/0378815 A1* | 12/2015 | Goda | G11C 11/5642 |
| | | | 714/764 |
| 2017/0062067 A1 | 3/2017 | Yang et al. | |
| 2017/0070241 A1 | 3/2017 | Kaku et al. | |
| 2017/0102991 A1* | 4/2017 | Haratsch | G06F 3/065 |
| 2017/0148525 A1 | 5/2017 | Kathawala et al. | |
| 2017/0249211 A1 | 8/2017 | Hoei et al. | |
| 2018/0011753 A1 | 1/2018 | Alhussien et al. | |
| 2018/0018233 A1* | 1/2018 | Kim | G06F 11/1096 |
| 2018/0293029 A1 | 10/2018 | Achtenberg et al. | |
| 2019/0097132 A1 | 3/2019 | Rajamohanan et al. | |
| 2019/0189202 A1 | 6/2019 | Avraham et al. | |
| 2019/0278655 A1 | 9/2019 | Koudele et al. | |
| 2020/0066353 A1 | 2/2020 | Pletka et al. | |
| 2021/0012857 A1 | 1/2021 | Xie et al. | |
| 2022/0028475 A1* | 1/2022 | Sharon | G11C 29/44 |

OTHER PUBLICATIONS

International Preliminary Report on Patentability for International Application No. PCT/US2019/016421, mailed Aug. 20, 2020, 10 Pages.

International Search Report and Written Opinion for International Application No. PCT/US2019/017333, mailed May 28, 2019, 11 Pages.

Yan S., et al., "Tiny-Tail flash: Near-Perfect Elimination of Garbage Collection Tail Latencies in NAND SSDs," ACM Transactions on Storage (TOS), 2017, vol. 13, No. 3, 15 Pages.

* cited by examiner

200

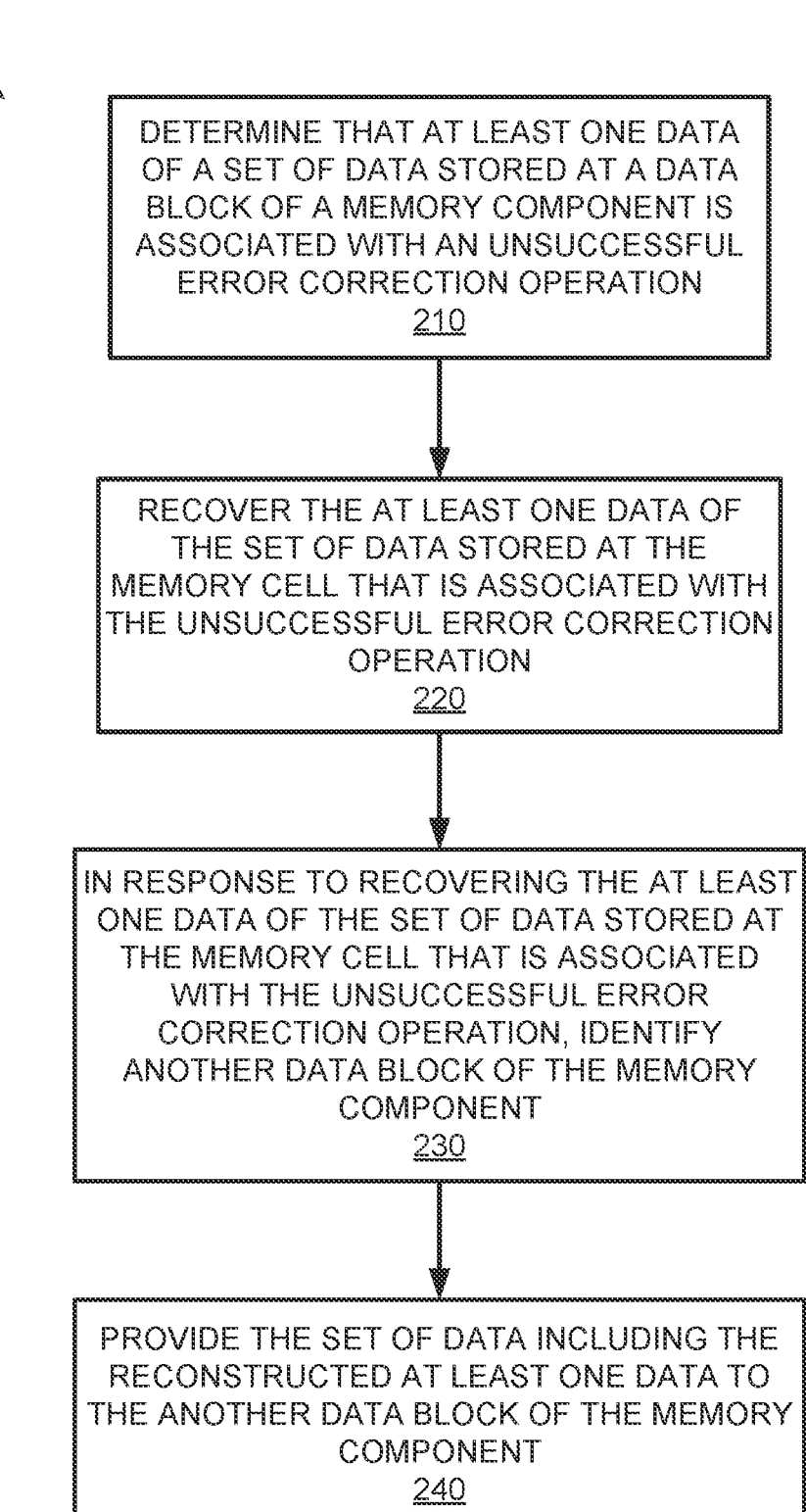

DETERMINE THAT AT LEAST ONE DATA
OF A SET OF DATA STORED AT A DATA
BLOCK OF A MEMORY COMPONENT IS
ASSOCIATED WITH AN UNSUCCESSFUL
ERROR CORRECTION OPERATION
210

RECOVER THE AT LEAST ONE DATA OF
THE SET OF DATA STORED AT THE
MEMORY CELL THAT IS ASSOCIATED WITH
THE UNSUCCESSFUL ERROR CORRECTION
OPERATION
220

IN RESPONSE TO RECOVERING THE AT LEAST
ONE DATA OF THE SET OF DATA STORED AT
THE MEMORY CELL THAT IS ASSOCIATED
WITH THE UNSUCCESSFUL ERROR
CORRECTION OPERATION, IDENTIFY
ANOTHER DATA BLOCK OF THE MEMORY
COMPONENT
230

PROVIDE THE SET OF DATA INCLUDING THE
RECONSTRUCTED AT LEAST ONE DATA TO
THE ANOTHER DATA BLOCK OF THE MEMORY
COMPONENT
240

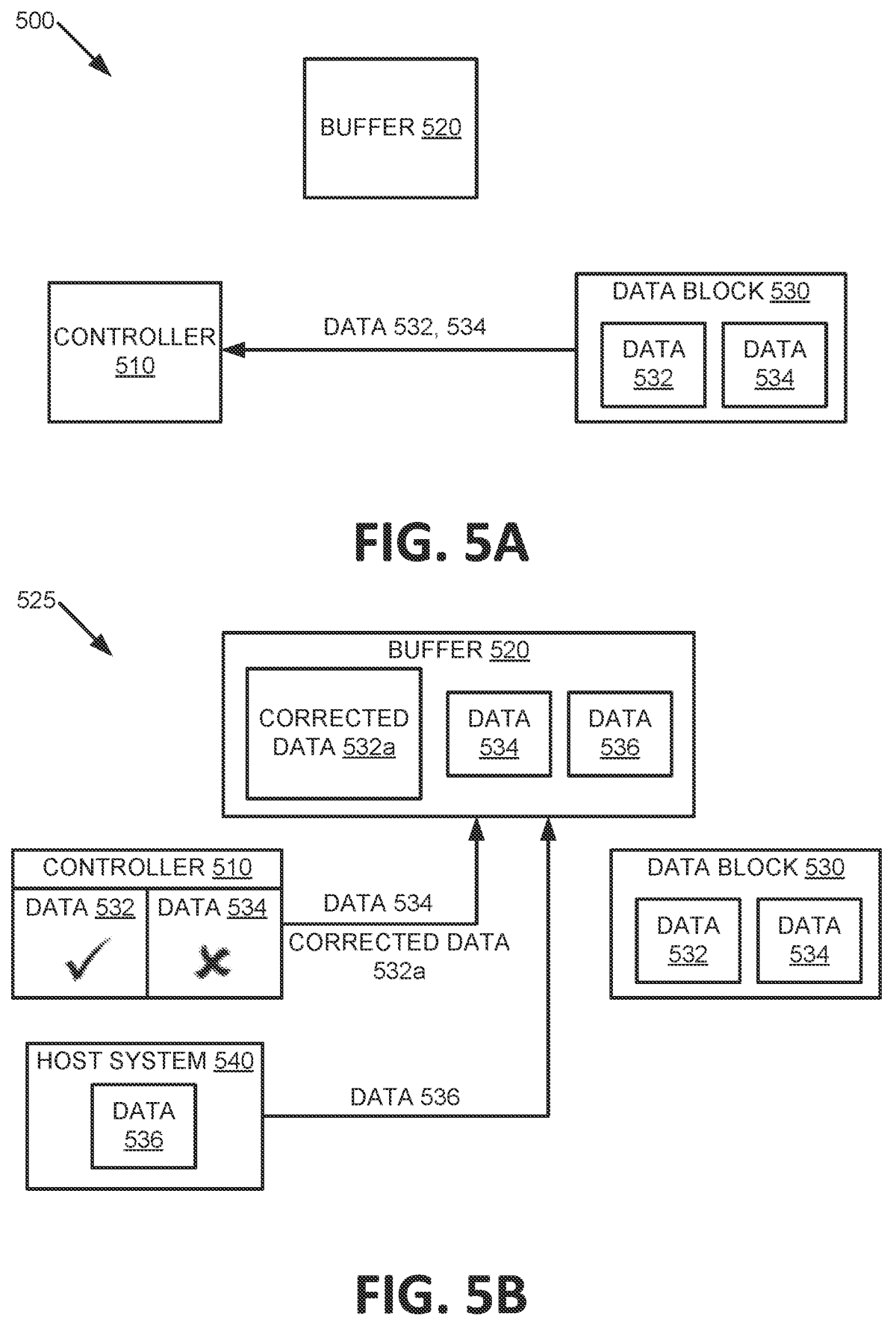

BUFFER 520

CONTROLLER 510 ← DATA 532, 534 ← DATA BLOCK 530

DATA BLOCK 530
DATA 532   DATA 534

BUFFER 520
CORRECTED DATA 532a   DATA 534   DATA 536

CONTROLLER 510
DATA 532 ✓   DATA 534 ✗

DATA 534
CORRECTED DATA 532a

DATA BLOCK 530
DATA 532   DATA 534

HOST SYSTEM 540
DATA 536

DATA 536

FIG. 5B

PROVIDING RECOVERED DATA TO A NEW MEMORY CELL AT A MEMORY SUB-SYSTEM BASED ON AN UNSUCCESSFUL ERROR CORRECTION OPERATION

RELATED APPLICATIONS

This application is a continuation of U.S. patent application Ser. No. 17/350,866 filed on Jun. 17, 2021, which is a continuation of U.S. patent application Ser. No. 16/100,681 filed on Aug. 10, 2018, and issued as U.S. Pat. No. 11,068, 186 on Jul. 20, 2021, which claims the benefit under 35 U.S.C. § 119(e) of U.S. Provisional Application 62/628,706 filed on Feb. 9, 2018. The entire content of the above-referenced applications is incorporated by reference herein.

TECHNICAL FIELD

Embodiments of the disclosure relate generally to memory sub-systems, and more specifically, relate to providing recovered data to a new memory cell at a memory sub-system based on an unsuccessful error correction operation.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 2 is a flow diagram of an example method to provide data to a new data block at a memory sub-system based on an unsuccessful error correction/handling operation in accordance with some embodiments of the present disclosure.

FIG. 5A illustrates an example of providing data from a data block of a memory sub-system in accordance with some embodiments of the present disclosure.

FIG. 5B illustrates providing data of a memory sub-system to a buffer after performance of an error correction/handling operation in accordance with some embodiments of the present disclosure.

DETAILED DESCRIPTION

Figure 1:
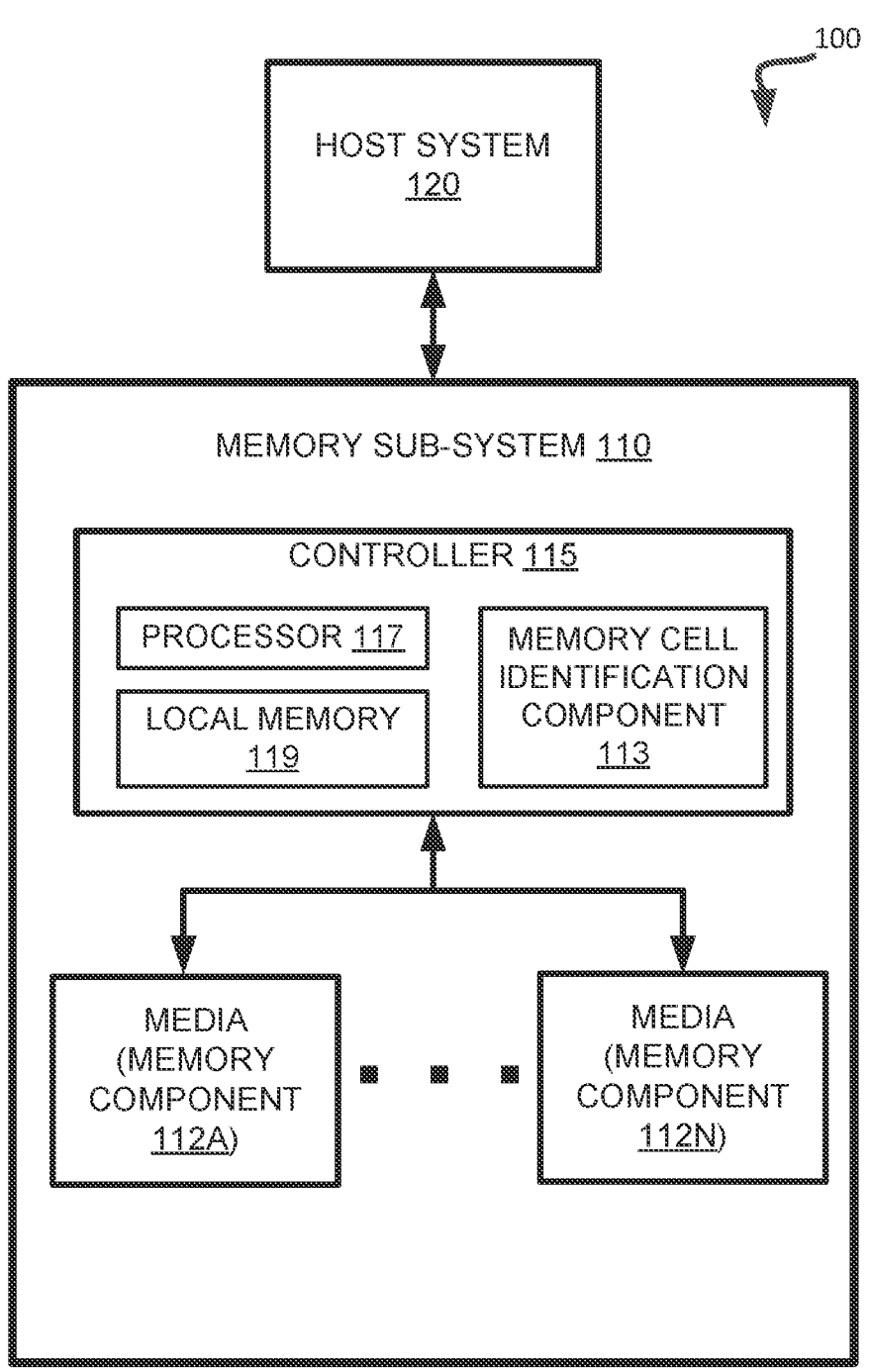
FIG. 1 illustrates an example computing environment that includes a memory sub-system in accordance with some embodiments of the present disclosure.

Aspects of the present disclosure are directed to providing recovered data to a new memory cell at a memory sub-system based on an unsuccessful error correction operation. An example of a memory sub-system is a storage system, such as a solid-state drive (SSD). In some embodiments, the memory sub-system is a hybrid memory/storage system. In general, a host system can utilize a memory sub-system that includes one or more memory components. The host system can provide data to be stored at the memory sub-system and can request data to be retrieved from the memory sub-system.

The memory sub-system can store the data at data blocks of a memory component included in the memory sub-system. Each data block can include one or more memory cells to store data. Each of the memory cells can store one or more bits of binary data corresponding to the data received from the host system. The memory component can include a quad-level cell (QLC) memory. In QLC memory, each memory cell can store four bits of data. For example, in a QLC memory, a memory cell can store four bits of data (e.g., 1111, 0000, 1101, etc.) corresponding to data received from the host system. Each bit of the memory cell is stored at a different portion (also referred to as "page" hereafter) of the memory cell. A memory cell of the QLC memory can have a total of four pages. A bit can be represented by each of the four pages of the memory cell. In a memory cell for a QLC memory, each combination of four bits can correspond to a different voltage level (also referred to as "level" hereafter).

The memory sub-system can receive a request from a host system to perform a programming operation to store data at the QLC memory. The memory sub-system can store the data by performing a two-pass programming operation on the memory cells of memory components in the memory sub-system. During a first programming pass of the two-pass programming operation, the memory sub-system programs a number of pages to one or more memory cells. For example, during the first programming pass of a QLC memory, three of the four pages are programmed based on data received from the host system. The second programming pass can then be performed on the memory cell to program the last page of data to the memory cell by using the information about the three pages programmed in the first programming pass.

In an example using QLC memory, during the second programming pass, the remaining page of data is received from the host and the three pages that were programmed during the first programming pass are read from the memory component of the memory sub-system. If a measured error rate on for a page that has the highest error rate of the three pages is below a threshold, then the remaining two pages are not provided for an error correction/handling operation. Rather, the remaining two pages can be internally read within the memory component and used for the second programming pass.

If the measured error rate of the page that is anticipated to have the highest error rate among the three pages exceeds a threshold, then the other two pages are read from the memory and an error correction/handling operation can be performed on the two pages. The error correction/handling operation results in corrected data that is provided to the memory component for storage during the second programming pass. Therefore, memory pages associated with a high anticipated error rate are provided for an error correction/handling operation, while memory pages associated with a low anticipated error rate are stored internally on a buffer of the memory component, reducing the amount of data being provided for error correction/handling operations.

Generally, when data (e.g., one or more memory pages) is read from a conventional memory sub-system the data stored on the memory cell of the conventional memory sub-system can include errors caused by noise or error/disturb mechanisms that cause a value (e.g., a bit) of the stored data to switch (e.g., from a '0' to a '1'). The error can be detected and corrected based on an error correction/handling operation. The error correction/handling operation can include one or more read retries using different parameters, such as a change in voltage threshold, as the initial read operation performed on the memory cell. The error correction/handling operation can also use hard information that corresponds to the bit values (e.g., a 0 or a 1) read from a memory cell and soft information that corresponds to a probability that the hard information read from the memory cell is correct to correct the bit values stored at a memory cell.

Since the remaining portion of data to be programmed during the second programming pass depends on the data (e.g., the three pages) stored at the memory cell during the first programming pass being correct (e.g., not including errors), the memory sub-system can perform the error correction/handling operation on one or more pages of data stored at the memory cell during the first programming pass. For example, the memory sub-system can read only one of the pages of data from the memory component based on anticipated error rates and perform an error correction/handling operation on the one page.

However, in some instances the error correction/handling operation may not be able to correct an error in the data stored at one or more of the three pages of the memory cell, resulting in an unsuccessful error correction/handling operation. If the error correction/handling operation fails to correct the data, the memory can system can perform a recovery operation on the data. The recovery operation can use a logical operation to recovery data. In some embodiments, the logical operation can be based on a redundant array of independent NAND (RAIN). RAIN utilizes a similar scheme to a redundant array of independent disks (RAID) for NAND memory components. In one example, an unsuccessful error correction/handling operation can indicate that the memory storing the data is impacted by a noise or error mechanism that can result from a physical defect of a memory cell. Since the data stored at the remaining page that is programmed during the second programming pass depends on the data at the first three pages not including errors, the data stored at the remaining page can also include errors if the remaining portion is programmed at the memory cell during the second programming pass.

The performance of a recovery operation can be reserved for data that cannot be corrected by an error correction/handling operation since the recovery operation is a time intensive operation. In order to minimize or prevent the delaying of subsequent programming operations by the memory sub-system while recovery operations are performed, the second programming pass can be performed despite one or more of the pages from the first programming pass being uncorrected by the error correction/handling operation. After the pages have been programmed to the memory component, a recovery operation is performed on the uncorrected data from the first programming pass once the subsequent programming operations have been performed by the memory sub-system.

Aspects of the present disclosure address the above and other deficiencies by providing recovered data to a new memory cell at a memory sub-system based on an unsuccessful error correction/handling operation while minimizing the delay of performance of incoming read/program requests from the host. For example, a first programming pass can be performed on a memory cell at a memory sub-system to provide data to one or more pages of the memory cell.

During the second programming pass, the memory sub-system can perform a read operation (e.g., an external read that provides the data to a memory controller or host system) on the one or more pages of data stored at the memory cell during the first programming pass. The memory sub-system can perform an error correction/handling operation on the data read from the memory cell. In some embodiments, the memory sub-system can determine an error rate associated with the data during the performance of the error correction/handling operation. In an embodiment, if the error correction/handling operation is successful on the data stored at the memory cell, then the corrected data can be stored in a relocate buffer that stores the corrected data that is to be relocated or written to a memory component of the memory sub-system during a second programming pass. Otherwise, if the error correction/handling operation is unable to correct the errors of the data stored at the memory cell, the data can provided to the relocate buffer of the memory sub-system for storage and flagged to indicate that a recovery operation is to be performed on the uncorrected data.

A recovery operation (e.g., RAIN) can be performed to recover the data that was received from the host system and stored at the memory cell during the first programming pass. The recovery operation can be a logical operation (e.g., an exclusive-or (XOR)) operation that is performed between other data and parity data associated with the three pages programmed during the first programming pass to generate a recovered data. The other data can correspond to redundant data associated with the three pages during the first programming pass that is stored at another memory component of the memory sub-system. The data associated with the second programming pass can also be stored at the buffer that includes the data associated with the unsuccessful error correction/handling operation from the first programming pass as well as other data from the first programming pass, such as data stored at the memory cell that does not include an error, corrected data resulting from the error correction/handling operation and/or data from the second programming pass. The one or more pages of data in the relocate buffer that failed error correction/handling can be recovered by a RAIN operation.

The memory sub-system can recover the data that could not be corrected by the error correction/handling operation. For example, the data can be recovered based on parity data associated with a recovery operation that is implemented after the second programming pass of the memory component.

Because an unsuccessful error correction/handling operation can be indicative of a faulty memory cell, the memory sub-system can identify another memory block that includes multiple other memory cells to store the recovered data as well as the received data from the host system. After identifying the other memory block, the recovered data, the other data and the received data can be provided to the identified other memory block for storage at pages of the other memory cell.

Advantages of the present disclosure include, but are not limited to, an increased reliability of data stored at the storage system as well as increased system performance. By delaying the performance of the recovery operation on the one or more pages failing the error correction/handling operation, computing resources are not being dedicated to the recovery operation, preventing the delay of incoming read/write requests from the host system, resulting in increased system performance. Furthermore, identifying and providing the recovered data to another memory block can prevent the storage of data on a malfunctioning memory cell, resulting in improved data retention accuracy and overall performance of the memory sub-system. Additionally, although the present disclosure describes performing various operations during a two-pass programming operation on a memory cell of a QLC memory, aspects of the present disclosure can be applied to any number (e.g., one or more) programming operations for any type of memory.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EE-PROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a memory cell identification component 113 that can be used to identify a new memory cell for data associated with an unsuccessful error correction/handling operation. In some embodiments, the controller 115 includes at least a portion of the characteristic component 113. For example, the controller 115 can include a processor 117 (processing device) configured to execute instructions stored in local memory 119 for performing the operations described herein. In some embodiments, the memory cell identification component 113 is part of the host system 110, an application, or an operating system.

The memory cell identification component 113 can determine that data stored at a memory cell of a memory component is associated with an unsuccessful error correction/handling operation. The memory cell identification component 113 can recover the data associated with the unsuccessful error correction/handling operation. The memory cell identification component 113 can identify another memory cell of memory sub-system 110 in response to recovering the data associated with the unsuccessful error correction/handling operation. The memory cell identification component 113 can provide the recovered data as well as any additional data stored at the memory cell to the new memory cell for storage at the new memory cell. Further details with regards to the operations of the memory cell identification component 113 are described below.

The memory sub-system 110 can also include additional circuitry or components that are not illustrated. In some implementations, the memory sub-system 110 can include a cache or buffer (e.g., DRAM) and address circuitry (e.g., a row decoder and a column decoder) that can receive an address from the controller 115 and decode the address to access the memory components 112A to 112N.

FIG. 2 is a flow diagram of an example method 200 to provide data to a new data block at a memory sub-system based on an unsuccessful error correction/handling operation, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory cell identification component 113 of FIG. 1.

At block 210, a processing device determines that at least one data of a set of data stored at a data block of a memory component is associated with an unsuccessful error correction/handling operation. The data block includes one or more memory cells of a memory component for storing one or more bits of user data. In some embodiments, the set of data stored at the data block can be stored during a prior programming operation. For example, the set of data can be stored at the data block during a first programming pass of a two-pass programming operation. In some embodiments, the set of data can include the at least one page of data associated with an unsuccessful error correction/handling operation as well as other data, such as data stored at the data block that does not contain an error or corrected data resulting from the performance of an error correction/handling operation, as previously discussed. In one embodiment, the set of data can include subsequent data received from the host system, such as subsequent data that is to be programmed to the data block during the second programming pass of the two-pass programming operation. In embodiments, the set of data can be provided to a buffer of the memory sub-system for storage.

In an embodiment, the processing device determines that the at least one data is associated with an unsuccessful error correction/handling operation based on identification information associated with the at least one data being present in a data structure indicating data that is associated with an unsuccessful error correction/handling operation. For example, the processing device can determine the at least one data is associated with an unsuccessful error correction/handling operation if identification information (e.g., address information, page number, etc.) associated with the at least one data is present in the data structure indicating data stored at the storage system that is associated with an unsuccessful error correction/handling operation. The data structure can be used to determine which pages of data are to be recovered after the second programming pass is performed.

At block 220, the at least one data of the set of data stored at the data block that is associated with the unsuccessful error correction/handling operation is recovered. In an embodiment, the data can be recovered based on parity data associated with a recovery operation that is implemented following the second programming pass. As previously discussed, the data programmed during the two-pass programming can include errors that could not be corrected by an error correction/handling operation. Pages of data that could not be corrected by the error correction/handling operation are identified in the data structure. In some embodiments if none of the pages of data programmed are identified in the data structure, then the two-pass programming completed without uncorrectable errors and no recovery operation is performed on the data.

However, if one or more pages of data are identified in the data structure, then the one or more pages of data include errors that could not be corrected by the error correction/ handling operation. In some embodiments, if the one or more pages include errors that could not be corrected, the two-pass program operation can be flagged by entering page information for the one or more pages that include errors that could not be corrected in the data structure. After the two-pass programming, if the two-pass programming operation has been flagged, then a recovery operation, such as RAIN recovery, is performed on the one or more pages identified in the data structure as having errors that could not be corrected by the error correction/handling operation. The uncorrected data stored in the relocated buffer can be replaced with the corrected data resulting from the recovery operation.

At block 230, another data block of the memory component is identified in response to recovering the at least one page of data of the set of data stored at the data block that is associated with the unsuccessful error correction/handling operation. As previously discussed, data stored at a data block being associated with an unsuccessful error correction/handling operation can indicate that the data block is faulty or malfunctioning (e.g., cannot reliably store data). Accordingly, another data block is identified for storage of the data. In some embodiments, the other data block is located on the same block stripe of a group of data blocks of the memory component as the initial data block. A block stripe can refer to a group of data that is received from a host system and a corresponding parity data that is generated for the group of data. Thus, the block stripe can be changed so that the prior data block that stored data that was associated with the unsuccessful error correction/handling operation is replaced with the other data block that is to store the data that has been recovered.

At block 240, the set of data including the recovered data is provided to the other data block identified at block 230. In embodiments, the set of data includes other data stored at the initial data block that is not associated with an unsuccessful error correction/handling operation.

Figure 3:
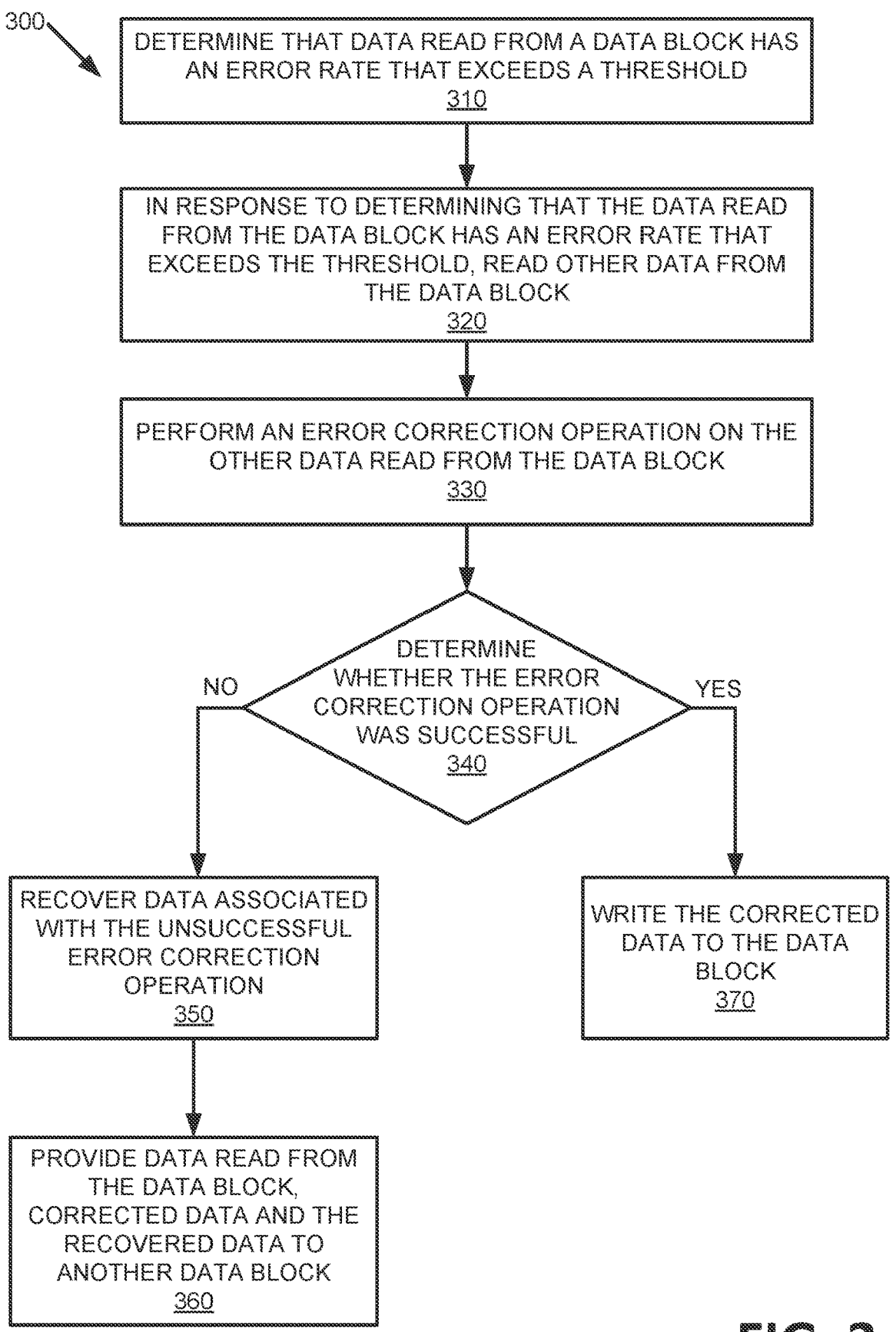
FIG. 3 is a flow diagram of an example method to determine that data read from a data block has an error rate that exceeds a threshold and reading other data from the data block in response to the error rate exceeding the threshold in accordance with some embodiments of the present disclosure.

FIG. 3 is a flow diagram of an example method 300 to determine that data read from a data block has an error rate that exceeds a threshold and reading other data from the data block in response to the error rate exceeding the threshold, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory cell identification component 113 of FIG. 1.

At block 310, a processing device determines that data read from a data block has an error rate that exceeds a threshold. The error rate can be determined by performing an error correction/handling operation on the data read from the data block. The error rate exceeding the threshold can indicate that a page of data has been impacted by a severe noise/error mechanism. An error rate exceeding the threshold can also indicate that other pages of data written to the data block can be impacted by a similar noise/error mechanism, resulting in an increased error rate of the other pages of data. In embodiments, the error rate exceeding the threshold can correspond to a number of errors in the data read from the data block exceeding the correction capability of the error correction/handling operation. In an embodiment, the data read from the data block can be data stored at a first page of the data block during a prior programming operation, such as during a first programming pass of a two-pass programming operation. In embodiments, the error rate of the data read from the data block is determined during the performance of an error correction/handling operation on the data. The error rate corresponds to a number of bit errors per unit of time that the data stored at the data block includes an error. In some embodiments, the error rate associated with the data can be used as a proxy for other data stored at the data block during the first programming pass. For example, data programmed during the first programming pass can have similar error and disturb mechanisms. Therefore, an elevated error rate for the data stored at the data block can also indicate an elevated error rate for other data stored at the data block that was programmed in the first programming pass. Because the data and the other data stored at the data block are programmed during the first programming pass, the error rate of the data can be used to determine whether the other data likely includes an error. For example, if the error rate exceeds the threshold, indicating a relatively high error rate associated with the data, then the other data stored at the data block can also have a relatively high error rate. Accordingly, if the memory sub-system determines that the error rate exceeds the threshold, then the data read from the data block and the other data stored at the data block are provided for error correction.

As described above, in order for the error rate of the data that is read for error correction to be used as a proxy for other data stored at the data block, the error rate associated with the data is greater than an error rate associated with the other data programmed in first programming pass. For example, if three pages are programmed in the first pass and one page is read for error correction, the error rate for the one page should be higher than the other two pages in order for the one page to be used as proxy for other data stored at the memory cells of a data block. Therefore, if the error rate associated with the data is not greater than the error rate associated with the other data, then the error rates can be adjusted. The adjustment of the error rate can be based on the adjusting of program verify (PV) voltages for corresponding levels of the memory cell. The PV voltage for a particular level corresponds to a target voltage threshold, such that each memory cell at the particular level has a voltage threshold that exceeds the PV voltage. For example, if a particular level has a PV voltage of PV1, then the memory cells programmed to the particular level can have a voltage threshold that is greater than PV1. The PV voltages can be adjusted such that a desirable ordering between page error rates can be achieved. The operation to adjust the PV voltages (also referred to as a dynamic programming target (DPT) operation hereafter) can be performed over time. The input of the DPT operation uses page error rates and iteratively adjusts PV voltages associated with particular pages of a memory cell in an iterative process to achieve a desired error rate between different pages of the memory cell. A DPT operation can adjust the PV voltages associated with the memory cell so that a subsequent error rate associated with the data stored at the memory cell can be expected to be greater than a subsequent error rate associated with the other data stored at the memory cell. For example, the DPT operation can decrease the range of the PV voltage associated with the data stored at the memory cell and/or increase the range of the PV voltage associated with the other data stored at the memory cell to ensure that the subsequent error rate associated with the data is greater than the subsequent error rate associated with the other data. Further detail regarding the adjustment of PV voltages is described below in conjunction with FIGS. 4A and 4B.

At block 320, the other data is read from the data block in response to determining that the data read from the data block has an error rate that exceeds a threshold. In an embodiment, the other data can correspond to data stored at one or more pages of the data block. For example, the data at block 310 can be data stored at a first page of the data block. At block 330, an error correction/handling operation is performed on the other data that was read from the data block at block 320. In some embodiments, an error-correcting code (ECC) operation or another type of error detection and correction operation can be used to detect and correct the error. In an embodiment, if the error correction/handling operation performed on the other data is unsuccessful, then identification information associated with the other data (e.g., address information, page number, etc.) can be stored in a data structure indicating that the other data is associated with an unsuccessful error correction/handling operation. In embodiments, the two-pass programming operation can be flagged to indicate that at least one page of data was not corrected by error correction/handling operation.

At block 340, a determination is made as to whether the error correction/handling operation performed the other data at block 330 were successful. If the other data are associated with an unsuccessful error correction/handling operation, then method 300 proceeds to block 350 where a second programming pass is performed with the other data that could not be corrected by error correction/handling operation and the two-pass programming operation is flagged for a subsequent recovery operation. The data and/or the other data can be associated with an unsuccessful error correction/handling operation when a number of errors in the data and/or the other data exceeds an error correction capability of the error correction/handling operation. In some embodiments, the other data is determined to be associated with an unsuccessful error correction/handling operation by querying a data structure of the memory sub-system that identifies data associated with an unsuccessful error correction/handling operation. For example, the other data read from the data block can be determined to be associated with an unsuccessful error correction/handling operation if identification information associated with the other data is located in the data structure indicating that the other data is associated with an unsuccessful error correction/handling operation. The identification information, such as address information and/or page number, can be used to locate the other data stored at a memory component of the memory sub-system and provide the other data for the recovery operation. If the error correction/handling operations performed on the data and the other data at block 330 are successful, then method 300 proceeds to block 370.

At block 350, data that is associated with an unsuccessful error correction/handling operation is recovered at a later time after the second programming pass has completed. For example, if the other data is associated with an unsuccessful error correction/handling operation, then the other data is recovered. In embodiments, the other data is recovered based on parity data associated with a redundancy operation implemented during a first programming operation, as previously discussed. At block 360, data read from the data block, corrected data, and/or the recovered data are provided to another data block of the memory sub-system. For example, if the data read at block 310 is determined to not include any errors and the other data read at block 320 is recovered at block 350, then the data read at block 310 and the recovered other data at block 350 are provided to another data block. In embodiments, the data block having data that could not be corrected can be flagged for a folding operation that moves all data written to the data block to a new data block. At block 370, if the error correction/handling operations on the data read at block 310 and the other data read on block 320 are successful, then the corrected data and the corrected other data are written to the same or original data block from which the data and the other data were read during the second programming pass.

Figure 4A:
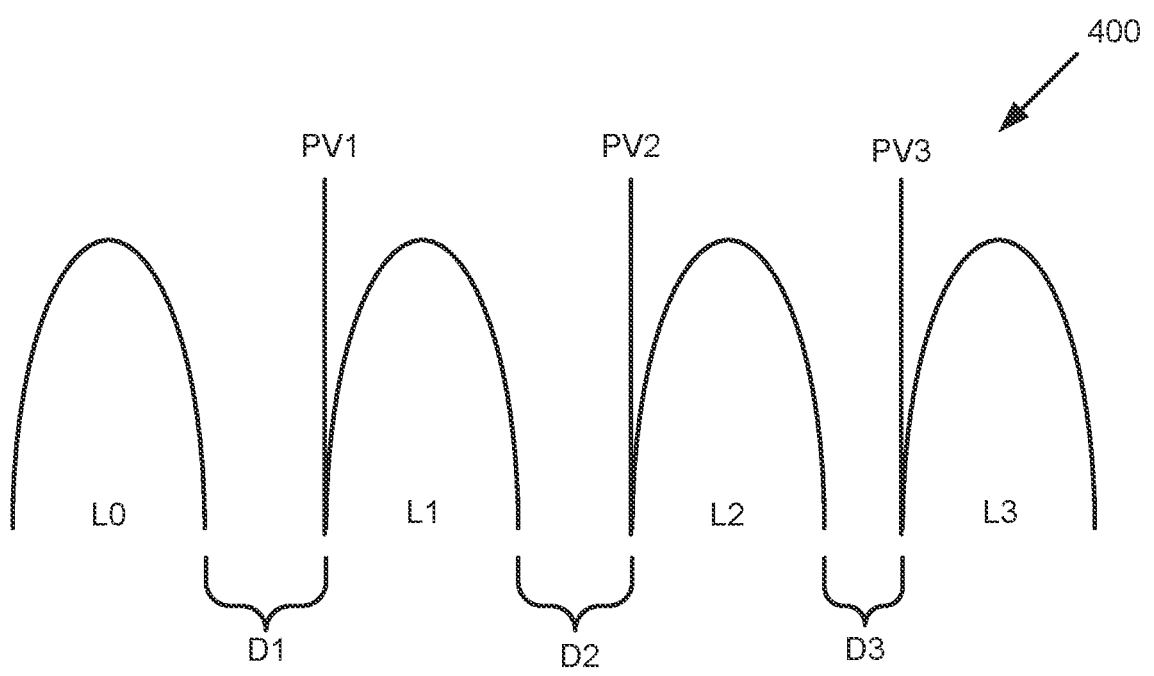
FIG. 4A illustrates an example of initial program verify voltages for levels of a memory cell in accordance with some embodiments of the present disclosure.

FIG. 4A illustrates an example of initial program verify voltages 400 for levels of a memory cell, in accordance with one embodiment of the present disclosure. As shown, a memory cell that stores two bits of data includes four levels L0, L1, L2, and L3 that can be programmed with three PV voltages (e.g., PV1 for L1, PV2 for L2 and PV3 for L3). In this example, the valley margin between L1 and L2 (D2) determines an expected error rate for data stored at a portion of the memory cell and the valley margin between L0 and L1 (D1) and L2 and L3 (D3) determines the error rate for data stored at another portion of the memory cell. The valley margin can correspond to a voltage range that is greater than a voltage range for a particular level, but less than the PV voltage for the next level. For example, the valley margin D1 is a voltage range that is greater than the maximum voltage of L0 and less than the PV voltage for the next level (e.g., PV1 of L1).

Figure 4B:
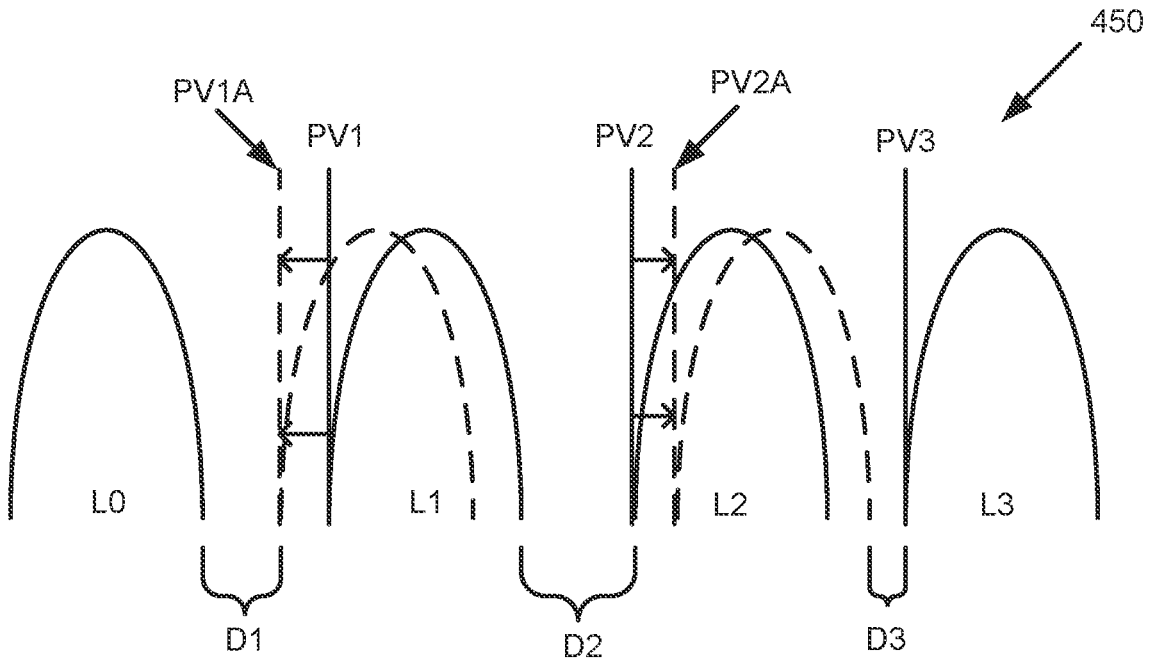
FIG. 4B illustrates an example of adjusting program verify voltages to increase or decrease the error rates of data stored at portions of the memory cell in accordance with some embodiments of the present disclosure.

FIG. 4B illustrates an example of adjusting program verify voltages 450 to increase or decrease the error rates of data stored at portions the memory cell, in accordance with some embodiments of the present disclosure. As shown, the error rate for the data stored at the portion of the memory cell is to be decreased so that the error rate for the data stored at the portion of the memory cell is less than the error rate for the data stored at the other portion of the memory cell. For example, PV2 can be shifted to the right (e.g., PV2A), which decreases the valley margin D3 between shifted L2 and L3 while also increasing the valley margin D2 between L1 and L2. The result is a decrease in the error rate associated with the data stored at the portion of the memory cell by increasing the distance D2 associated with data stored at the first portion of the memory cell. Furthermore, the expected error rate associated with the data stored at the other portion of the memory cell is increased by decreasing the distance D3 associated with the error rate for data stored at the second portion of the memory cell.

In another example, PV1 can be shifted to the left (e.g., PV1A), which decreases valley margin D1 between shifted L1 and L0 and increases distance D2 valley margin shifted L1 and L2. This results in a decrease in the error rate associated with the data stored at the portion of the memory cell by increasing the distance D2 associated with data stored at the portion of the memory cell. Furthermore, the error rate associated with the data stored at the other portion of the memory cell is increased by decreasing the distance D1 associated with the error rate for data stored at the other portion of the memory cell.

FIG. 5A illustrates an example of providing data from a data block of a memory sub-system 500, in accordance with embodiments of the present disclosure. The memory sub-system 500 includes a controller 510, a buffer 520 and a data block 530. In some embodiments, controller 510 includes at least a portion of buffer 520. In one embodiment, buffer 520 can be located inside the memory 530. Data 532 and data 534 can be stored at different pages of data block 530. For example, data 532 is stored at a first page of data block 530 and data 534 is stored at a second page of data block 530. In the present illustration data 532 is provided to controller 510, where an error correction/handling operation is to be performed on data 532 and data 534 by controller 510. Data 532 can act as a proxy for data 534, where data 534 is provided to controller 510 based on an error rate associated with data 532 exceeding a threshold, as previously discussed in FIG. 3.

FIG. 5B illustrates providing data of memory sub-system 525 to a buffer after performance of an error correction/handling operation, in accordance with some embodiments of the present disclosure. In the present illustration, the error correction/handling operation performed on data 532 was successful, resulting in corrected data 532a. In the present example, the error rate associated with data 532 was higher than the threshold, causing the external read of data 534 to controller 510. However, the error correction/handling operation performed on data 534 was unsuccessful. The corrected data 532a and data 534 (e.g., uncorrected data) are provided to buffer 520 for storage. Controller 510 can also provide identification information associated with data 534 to a data structure that indicates data 534 is associated with an unsuccessful error correction/handling operation. Following the error correction/handling operation, data 536 is received from host system 540 to be programmed to data block 530. Data 536 is stored at buffer 520 with corrected data 532a and uncorrected data 534. During the second programming pass, corrected data 532a, uncorrected data 534 and data 536 are programmed to data block 430. In embodiments, because the second programming pass includes uncorrected data 534, the two-pass programming operation can be flagged for a recovery operation.

Figure 5C:
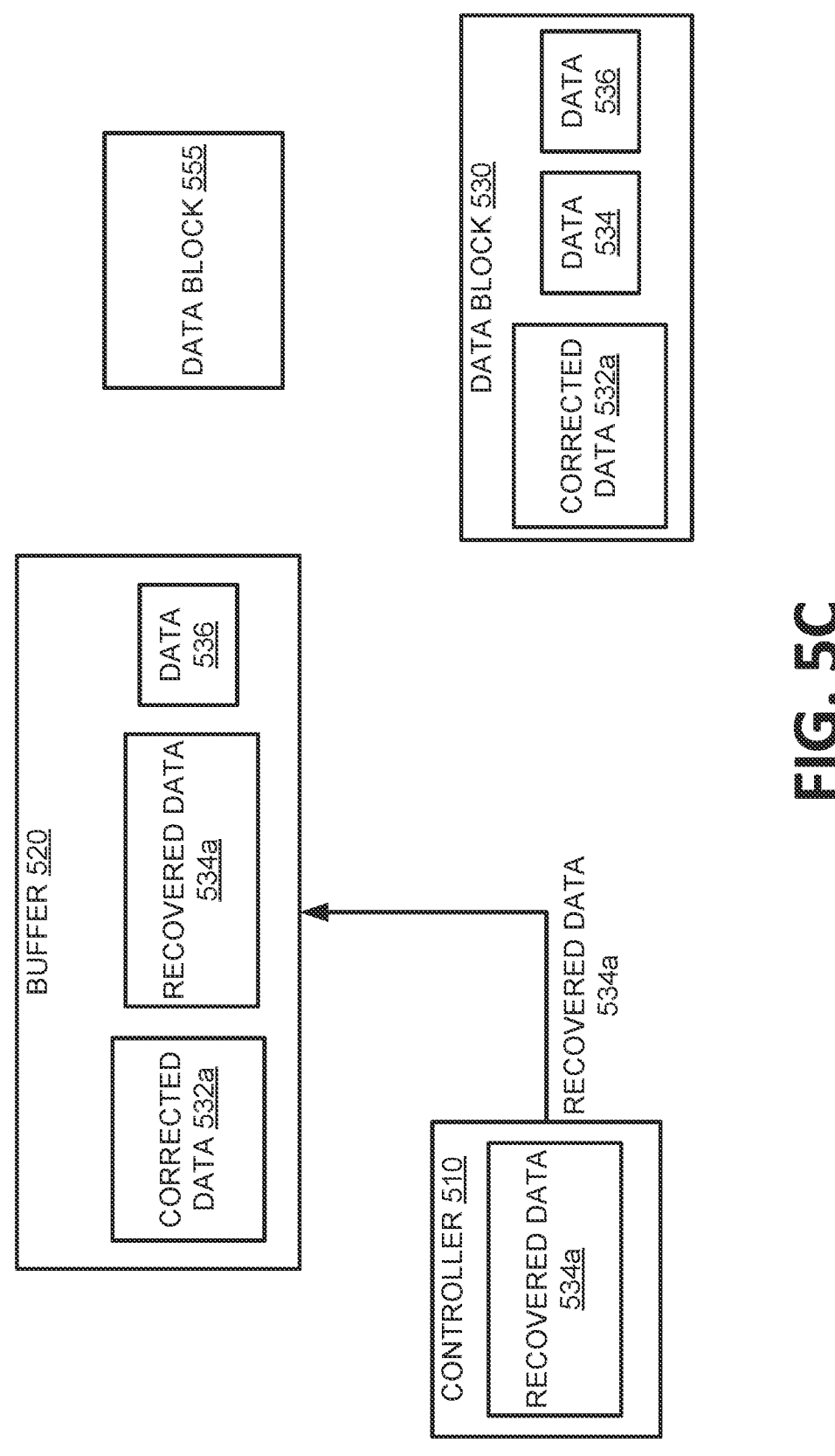
FIG. 5C illustrates recovering data of a memory sub-system associated with an unsuccessful error correction/handling operation and identifying another data block in accordance with some embodiments of the present disclosure.

FIG. 5C illustrates recovering data of a memory sub-system 550 associated with an unsuccessful error correction/handling operation and identifying another data block, in accordance with an embodiment of the present disclosure. Controller 510 performs a recovery operation on data 534 as previously described, resulting in recovered data 534a. Controller 510 provides recovered data 534a to buffer 520 for storage, replacing uncorrected data 534. Furthermore, in response to performing the recovery operation, controller 510 identifies another data block 555 of memory sub-system 550 for storage of corrected data 532a, recovered data 534a and data 536. In embodiments, data block 530 can be flagged for a folding operation to be performed on the data stored at block 530.

Figure 5D:
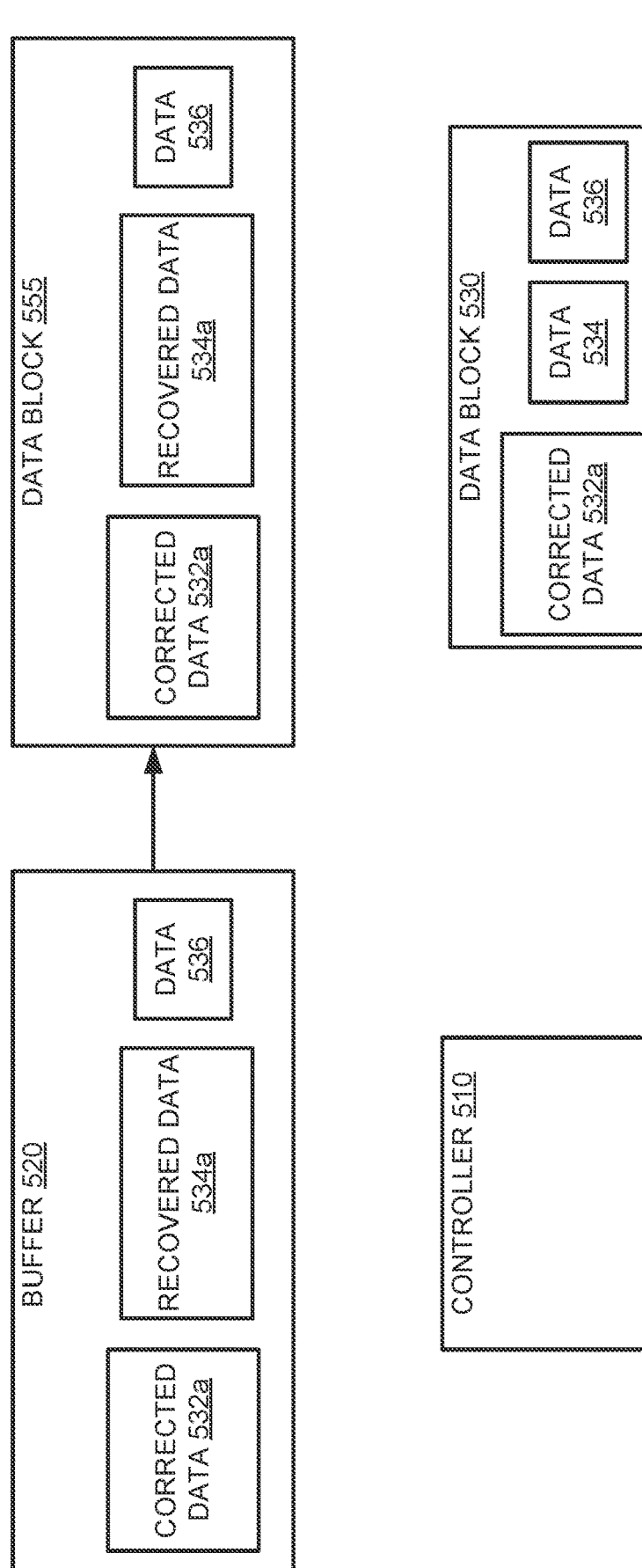
FIG. 5D illustrates providing data to another data block of a memory sub-system in accordance with some embodiments of the present disclosure.

FIG. 5D illustrates providing data to another data block of memory sub-system 575, in accordance with embodiments of the present disclosure. Corrected data 532a, recovered data 534a and data 536 are provided from buffer 520 to data block 555 for storage. In some embodiments, corrected data 532a is stored at a first page of data block 555, recovered data 534a is stored at a second page of data block 555 and data 536 is stored at a third page of data block 555. Although the present example illustrates operations being performed by controller 510 of a memory sub-system, in some embodiments the operations can be performed by other components of the memory sub-system. For example, the operations can be performed by the host system of the memory sub-system.

Figure 6:
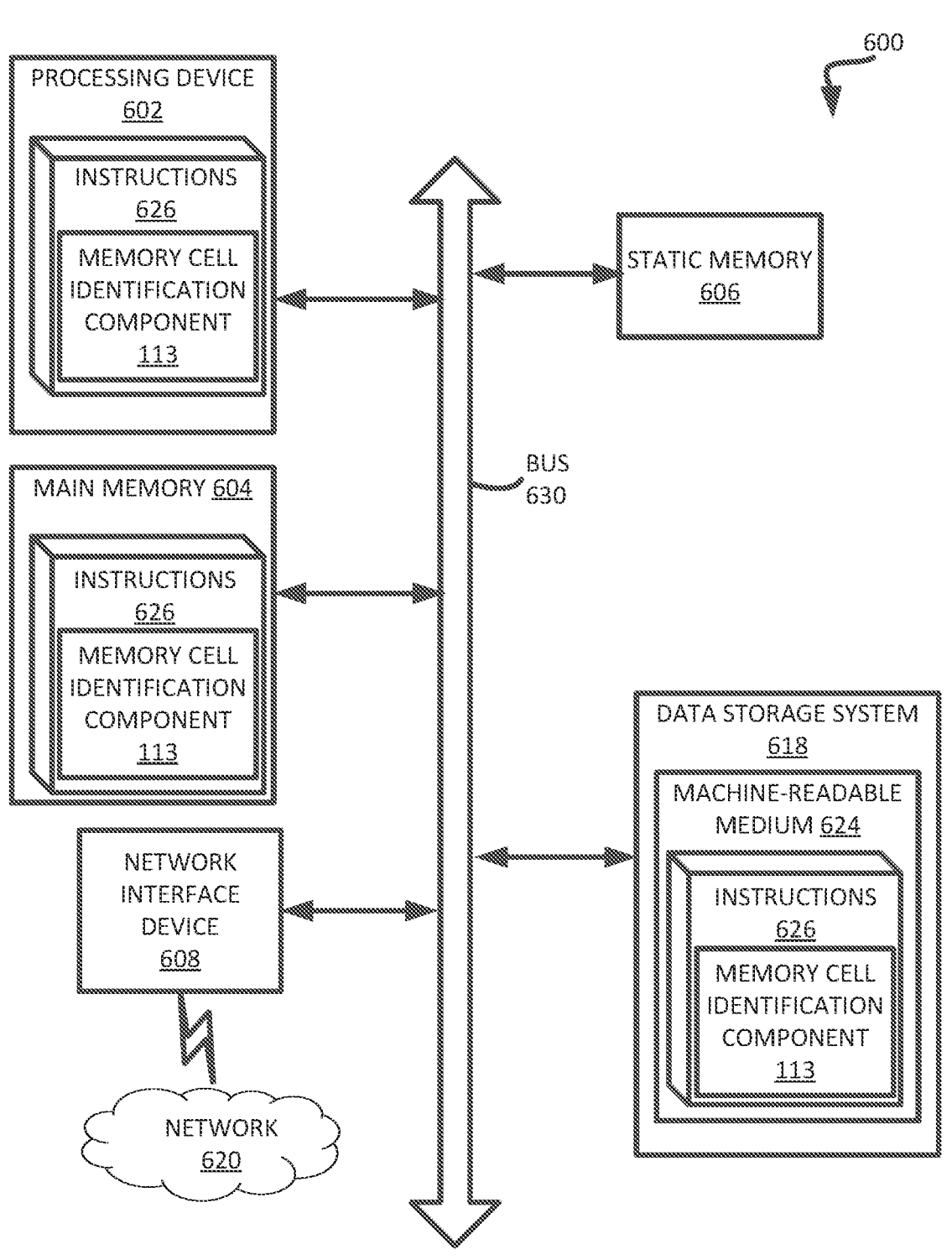
FIG. 6 is a block diagram of an example computer system in which implementations of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory cell identification component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a memory cell identification component (e.g., the memory cell identification component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory component; and a processing device, operatively coupled with the memory component, to:

perform a first pass of a two-pass programming operation to store a set of data at a first portion of the memory component;

designate a first subset of the set of data as a proxy for estimating an error rate of a second subset of the set of data, wherein an error rate of the first subset exceeding a threshold indicates that error correction is to be performed on the second subset;

determine that the second subset of the set of data is associated with an unsuccessful error correction operation;

responsive to completing a second pass of the two-pass programming operation with respect to the second subset of the set of data, recover the second subset of the set of data.

2. The system of claim 1, wherein the processing device is further to:

store the second subset of the set of data at a second portion of the memory component;

receive a second set of data associated with the set of data; and store the second set of data at the second portion of the memory component.

3. The system of claim 2, wherein the first portion of the memory component comprises a first block and the second portion of the memory component comprises a second block.

4. The system of claim 1, wherein determining that the second subset of the set of data is associated with an unsuccessful error correction operation is performed in response to performing a read operation with respect to the second subset of the set of data stored at the first portion of the memory component.

5. The system of claim 4, wherein the read operation is performed before the second pass of the two-pass programming operation.

6. The system of claim 1, wherein recovering the second subset of the set of data is based on parity data associated with the set of data.

7. The system of claim 1, wherein determining that the second subset of the set of data is associated with an unsuccessful error correction operation further comprises:

inspecting identification information stored in a data structure in association with the second subset of the set of data.

8. A method, comprising:

performing, by a processing device, a first pass of a two-pass programming operation to store a set of data at a first portion of a memory component;

designating a first subset of the set of data as a proxy for estimating an error rate of a second subset of the set of data, wherein an error rate of the first subset exceeding a threshold indicates that error correction is to be performed on the second subset;

determining that the second subset of the set of data is associated with an unsuccessful error correction operation;

responsive to completing a second pass of the two-pass programming operation with respect to the second subset of the set of data, recovering the second subset of the set of data.

9. The method of claim 8, further comprising:

storing the second subset of the set of data at a second portion of the memory component;

receiving a second set of data associated with the set of data; and storing the second set of data at the second portion of the memory component.

10. The method of claim 9, wherein the first portion of the memory component comprises a first block and the second portion of the memory component comprises a second block.

11. The method of claim 8, wherein determining that the second subset of the set of data is associated with an unsuccessful error correction operation is performed in response to performing a read operation with respect to the second subset of the set of data stored at the first portion of the memory component.

12. The method of claim 11, wherein the read operation is performed before the second pass of the two-pass programming operation.

13. The method of claim 8, wherein recovering the second subset of the set of data is based on parity data associated with the set of data.

14. The method of claim 8, wherein determining that the second subset of the set of data is associated with an unsuccessful error correction operation further comprises:

inspecting identification information stored in a data structure in association with the second subset of the set of data.

15. A non-transitory computer-readable storage medium comprising executable instructions that, when executed by a processing device, cause the processing device to:

perform a first pass of a two-pass programming operation to store a set of data at a first portion of a memory component;

designate a first subset of the set of data as a proxy for estimating an error rate of a second subset of the set of data, wherein an error rate of the first subset exceeding a threshold indicates that error correction is to be performed on the second subset;

determine that the second subset of the set of data is associated with an unsuccessful error correction operation;

responsive to completing a second pass of the two-pass programming operation with respect to the second subset of the set of data, recover the second subset of the set of data.

16. The non-transitory computer-readable storage medium of claim 15, further comprising executable instructions that, when executed by the processing device, cause the processing device to:

store the second subset of the set of data at a second portion of the memory component;

receive a second set of data associated with the set of data; and store the second set of data at the second portion of the memory component.

17. The non-transitory computer-readable storage medium of claim 15, wherein determining that the second subset of the set of data is associated with an unsuccessful error correction operation is performed in response to performing a read operation with respect to the second subset of the set of data stored at the first portion of the memory component.

18. The non-transitory computer-readable storage medium of claim 17, wherein the read operation is performed before the second pass of the two-pass programming operation.

19. The non-transitory computer-readable storage medium of claim 15, wherein recovering the second subset of the set of data is based on parity data associated with the set of data.

20. The non-transitory computer-readable storage medium of claim 15, wherein determining that the second subset of the set of data is associated with an unsuccessful error correction operation further comprises:

inspecting identification information stored in a data structure in association with the second subset of the set of data.

* * * * *